United States Patent
Wu

(10) Patent No.: US 6,495,910 B1
(45) Date of Patent: Dec. 17, 2002

(54) PACKAGE STRUCTURE FOR ACCOMMODATING THICKER SEMICONDUCTOR UNIT

(75) Inventor: Chi Chuan Wu, Taichung (TW)

(73) Assignee: Siliconware Precision Industries Co., Ltd., Tantzu Taichung (TW)

( * ) Notice: Subject to any disclaimer, the term of this patent is extended or adjusted under 35 U.S.C. 154(b) by 0 days.

(21) Appl. No.: 09/648,898

(22) Filed: Aug. 25, 2000

(51) Int. Cl.$^7$ ................................................ H01L 23/02
(52) U.S. Cl. ...................... 257/686; 257/723; 257/737; 257/697
(58) Field of Search ................................ 257/686, 737, 257/697, 723

(56) References Cited

U.S. PATENT DOCUMENTS

| | | | |
|---|---|---|---|
| 5,468,995 A | | 11/1995 | Higgins, III |
| 5,541,450 A | * | 7/1996 | Jones ......................... 257/697 |
| 5,550,403 A | * | 8/1996 | Carichner ................... 257/697 |
| 5,977,640 A | * | 11/1999 | Bertin et al. ................ 257/686 |
| 6,081,028 A | * | 6/2000 | Ettehadieh et al. ......... 257/687 |
| 6,235,996 B1 | * | 5/2001 | Farooq ........................ 257/737 |
| 6,259,163 B1 | * | 7/2001 | Ohuchi ....................... 257/779 |

FOREIGN PATENT DOCUMENTS

JP          405055450 A  *  3/1993

\* cited by examiner

Primary Examiner—Olik Chaudhuri
Assistant Examiner—Nathan W. Ha
(74) Attorney, Agent, or Firm—Klarquist Sparkman, LLP

(57) ABSTRACT

The present invention is characterized by replacing solder balls with cylindrical terminals in an IC package where at least a chip is located on the same side of the substrate of the IC package as the solder balls are. Due to the larger length of the cylindrical terminals which are located on the same side of the substrate of the IC package as at least a chip is, at least a chip with relatively thick size can be accommodated in the IC package provided by the present invention, without need of increasing terminal pitch (such as the ball pitch in a conventional BGA package). The accommodation of relatively thick chip in the IC package provided by the present invention leads to elimination or significant reduction of cost of back grinding of the chip, and to significant improvement on the failure rate resulting from the thinness of the chip in a conventional IC package, while without need of augmenting the size of the substrate of the IC package as a result that the terminal pitch based on the present invention needs not be increased.

20 Claims, 3 Drawing Sheets

PACKAGE STRUCTURE FOR ACCOMMODATING THICKER SEMICONDUCTOR UNIT

FIELD OF THE INVENTION

The present invention relates to an IC (integrated circuits) package, particularly to an improvement on an IC package of type BGA (ball grid array).

BACKGROUND OF THE INVENTION

FIG. 1 shows a conventional IC package 1 having solder ball 11 to connect external circuits or apparatus. Limited by the height of the solder ball 11, the bottom chip 16 (the chip located on a selected surface of substrate where at least a solder ball is also located on the selected surface) supported by substrate 12 must be very thin, resulting in problems that such a thin chip tends to rupture during fabricating process and the fabricating process incurs cost of back grinding of the chip. To overcome the problems inherent in conventional IC packages, solder ball 11 must be enlarged to raise its height, thereby the ball pitch of the solder ball and the size of substrate 12 will have to be augmented, resulting in bigger size of the entire IC package and higher cost of the substrate/package.

SUMMARY OF THE INVENTION

It is therefore an object of the present invention to provide an IC package accommodating at least a thicker chip, in order to significantly improve, without need of bigger size of chip carrier or the whole IC package, the failure rate of packaging chips resulting from the thinness of the chips being packaged.

It is therefore another object of the present invention to provide an IC package accommodating at least a thicker chip, in order to significantly reduce or eliminate cost of back grinding of the chips to be packaged.

The present invention is characterized by replacing solder balls with cylindrical terminals in an IC package where at least a chip is located on the same side of the substrate of the IC package as the solder balls are.

Although U.S. Pat. No. 5468995 also adopted cylindrical terminals for an IC package's outward connection, its object is to provide a solution to the problem of thermally induced stress inherent in IC package connection processes such as the connection between the IC package and a printed wiring board, and it disclosure is not related to the objects of the present invention. Furthermore the prior art was to suit an IC package where no chip is located on the same side of substrate as its cylindrical terminals are, and suggested no advantage of either abridging cost of back grinding of a chip or reducing the failure rate resulting from the thinness of a chip being packaged, therefore it is obvious that the present invention and the prior art are significantly different.

A basic structure of the IC package suggested by the present invention may comprise:
- a carrier (such as a substrate or any object capable of supporting at least a semiconductor unit and providing electrical connection) including a first surface that comprises at least a semiconductor connection zone and at least a terminal connection zone;
- at least a semiconductor unit (such as a flip chip or any type of chip) attached to the semiconductor connection zone;
- and at least a cylindrical terminal attached to the terminal connection zone, and electrically connected to the semiconductor unit via the carrier, wherein the length of the cylindrical terminal is larger than the maximum width of the cross section of the cylindrical terminal.

Another aspect of the IC package based on the present invention may comprise:
- a sheet of carrier including a first surface;
- at least a semiconductor unit;
- at least a cylindrical terminal; and
- a connection system for the semiconductor unit and the cylindrical terminal to respectively connect different portions of the first surface, and for the electrical connection between the semiconductor unit and the cylindrical terminal.

The present invention may best be understood through the following description with reference to the accompanying drawings, in which:

DETAILED DESCRIPTION OF THE PREFERRED EMBODIMENTS

Figure 1:
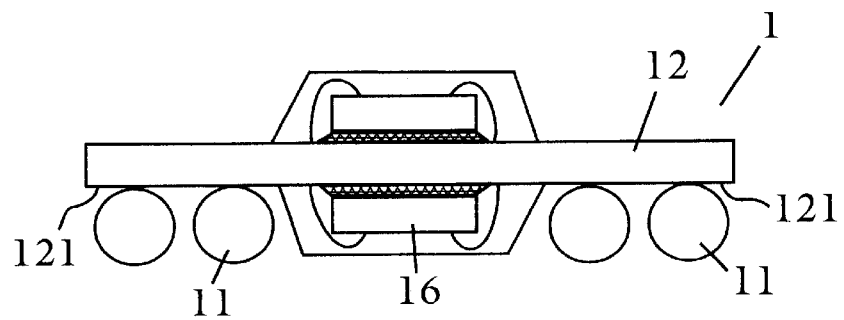
FIG. 1 shows a conventional IC package of type BGA.
Figure 2:
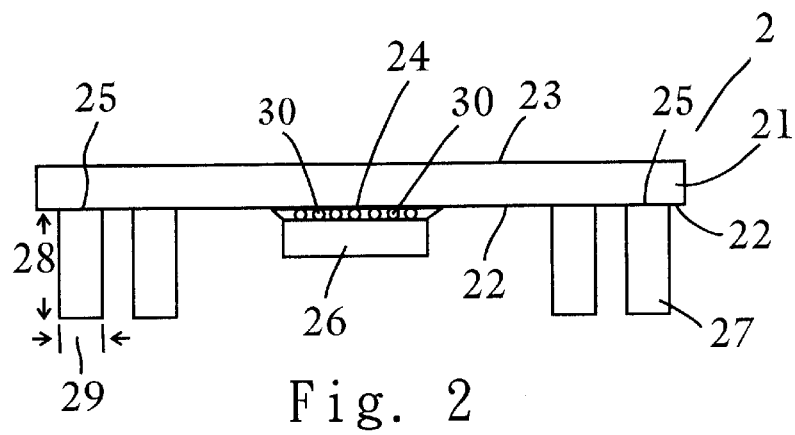
FIGS. 2~8 respectively shows various embodiments of the present invention.

FIG. 2 shows a package 2 which is an embodiment of the present invention. The package 2 in FIG. 2 comprises:
- a carrier 21 including a first surface 22 that comprises at least a semiconductor connection zone 24 (such as the relatively thick and black area in the figure) and at least a terminal connection zone 25;
- at least a semiconductor unit 26 (such as a flip chip) attached to the semiconductor connection zone 24 via at least a bump 30; and
- at least a cylindrical terminal 27 attached to the terminal connection zone 25, and electrically connected to the semiconductor unit 26 via the carrier 21, wherein the length 28 of the cylindrical terminal 27 is larger than the maximum width 29 of the cross section of the cylindrical terminal 27.

In FIG. 2, the carrier 21 may be a substrate and the semiconductor unit 26 may be a chip. The carrier 21 may comprise at least a trace (not shown in figure) for electrically connecting cylindrical terminal 27 and semiconductor connection zone 24. The trace electrically connects cylindrical terminal 27 via terminal connection zone 25 to provide electrical connection between semiconductor connection zone 24 and cylindrical terminal 27.

Figure 3:
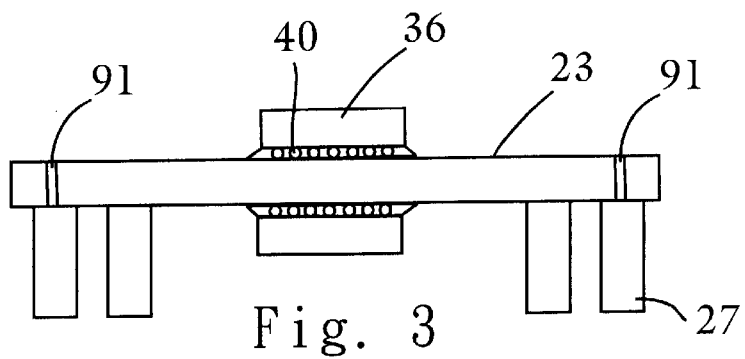

FIG. 3 shows another embodiment of the present invention which differs from the package 2 shown in FIG. 2. The difference is that the second surface 23 of carrier 21 in FIG. 3 supports another semiconductor unit 36 (such as a flip chip including bump 40) which may electrically connect cylindrical terminal 27 via a trace (not shown in figure) and a through-hole 91.

Figure 4:
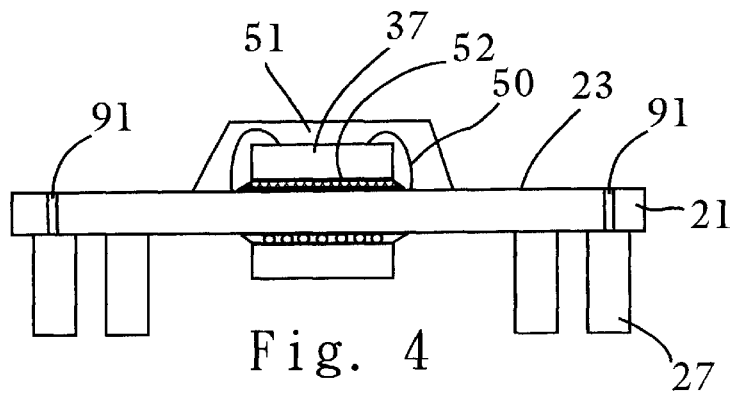

The difference between the embodiment of the present invention shown in FIG. 4 and the package 2 shown in FIG. 2 is that the second surface 23 of carrier 21 supports another semiconductor unit 37 such as a wire bonding chip having bonding wire 50 to electrically connect at least a trace located on carrier 21 (not shown in figure). A preferred embodiment includes at least a bonding finger (not shown in figure) for electrical connection between bonding wire 50 and the trace (not shown in figure). The semiconductor unit 37 and bonding wire 50 may be covered by a sealing structure 51 for purposes such as protection. The sealing structure may be an encapsulation.

Figure 5:
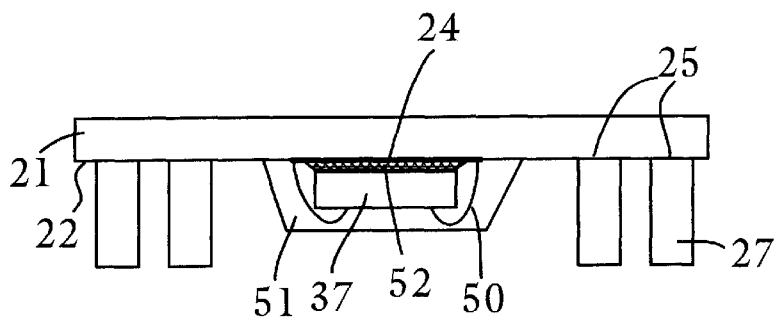

FIG. 5 differs from FIG. 2 in that the chip 37 attached to semiconductor connection zone 24 (such as the relatively thick and black area in the figure) on the second surface 22 of carrier 21 in FIG. 5 is a wire bonding chip electrically connecting the trace (not shown in the figure) on carrier 21 via bonding wire 50 and connecting semiconductor connection zone 24 via adhesive material 52. The wire bonding chip 37 and bonding wire 50 may be covered by sealing structure 51 for purposes such as protection.

Figure 6:
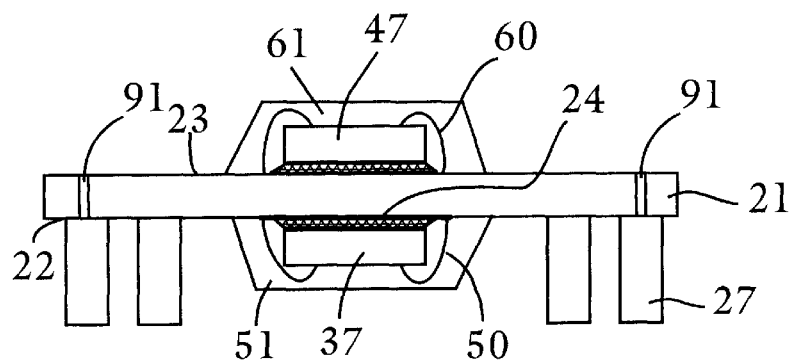

FIG. 6 differs from FIG. 5 in that another wire bonding chip 47 is attached to the second surface 23 of carrier 21 in FIG. 6, wherein chip 47 may electrically connect cylindrical terminal 27 via bonding wire 60, trace (not shown) on carrier 21, and through-hole 91.

Figure 7:
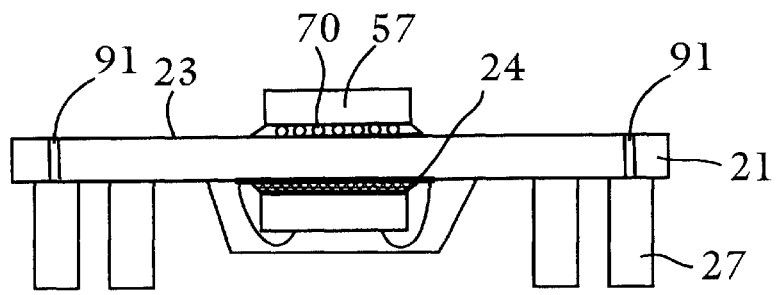

FIG. 7 differs from FIG. 5 in that a flip chip 57 is attached to the second surface 23 of carrier 21 in FIG. 7, wherein flip chip 57 may electrically connect cylindrical terminal 27 via bump 70, trace (not shown) on carrier 21, and through-hole 91.

Figure 8:
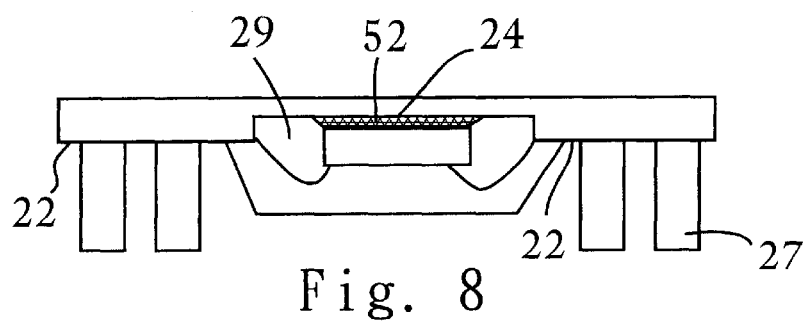

FIG. 8 differs from FIG. 5 in that the semiconductor connection zone 24 in FIG. 8 is in a depression 92 of the first surface 22 of carrier 21.

Figure 9:
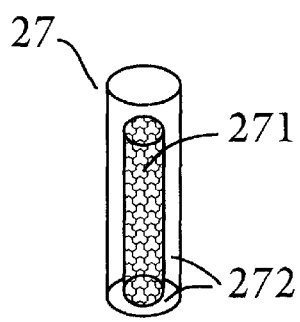
FIG. 9 shows an embodiment of the cylindrical terminal in an IC package provided by the present invention.

Obviously there may be a plurality of cylindrical terminals 27 evenly or symmetrically distributed outside semiconductor connection zone 24 in each of the above embodiments according to the present invention, wherein each cylindrical terminal 27 may be configured to include a core portion 271 and an outer portion 272 as shown in FIG. 9, with core portion 271 differing from outer portion 272 in that the melting point of core portion 271 is higher than the melting point of outer portion 272.

No matter what type the semiconductor unit is in each of the above embodiments of the present invention, a sealing structure such as 51 in FIG. 5 or FIG. 6 may be included to cover the semiconductor unit and/or bonding wire.

The semiconductor connection zone in each of the above embodiments according to the present invention may include adhesive material for the connection between the semiconductor unit and the semiconductor connection zone, and the terminal connection zone in each of the above embodiments according to the present invention may also include adhesive material for the connection between the cylindrical terminal and the terminal connection zone.

A further aspect of the present invention may be a package comprising: a sheet of carrier including a first surface, at least a semiconductor unit, at least a cylindrical terminal, and a connection system for connecting the semiconductor unit and the cylindrical terminal to different portions of the first surface and providing electrical connection between the semiconductor unit and the cylindrical terminal. For example, the connection system comprises a terminal connection zone (such as the one represented by 25 in FIG. 2) located on the first surface (such as the one represented by 22 in FIG. 2) for the connection between cylindrical terminal 27 and carrier 21, and a semiconductor connection zone (such as the one represented by 24 in FIG. 2 or FIG. 5) on the first surface for the connection between the semiconductor unit (such as the one represented by 26 in FIG. 2 or by 37 in FIG. 5) and carrier 21, and at least a trace (not shown in figure) on carrier 21 for the electrical connection between cylindrical terminal 27 and semiconductor unit (such as the one represented by 26 in FIG. 2 or by 37 in FIG. 5). The semiconductor unit may be a flip chip such as the one represented by 26 in FIG. 2, with bump 30 thereof connecting semiconductor connection zone 24 and electrically connecting the trace (not shown) which is electrically connected to cylindrical terminal 27 via terminal connection zone 25. The semiconductor unit may also be a wire bonding chip and the connection system may further comprise a bonding wire for electrically connecting the wire bonding chip to the trace. The semiconductor connection zone may include adhesive material such as the one represented by 52 in FIG. 5 for the connection between the wire bonding chip and the carrier. Obviously the terminal connection zone may also include adhesive material (not shown in figure) for the connection between the cylindrical terminal and the terminal connection zone.

While the invention has been described in terms of what are presently considered to be the most preferred embodiments, it shall not be limited to the disclosure. On the contrary, it shall be construed to cover various modifications and similar arrangements as well as any schemes based on the spirit and scope of invention.

What is claimed is:

1. A package for accommodating at least a relatively thick semiconductor unit, comprising:
    a carrier including a first surface which comprises at least a semiconductor connection zone and at least a terminal connection zone;
    at least a semiconductor unit attached to said semiconductor connection zone; and
    at least a cylindrical terminal attached to said terminal connection zone and connected to said semiconductor unit through said carrier, wherein the length of said cylindrical terminal is larger than the maximum width of the cross section of said cylindrical terminal, and said cylindrical terminal includes a core portion and an outer portion, the melting point of said core portion being higher than that of said outer portion.

2. The package according to claim 1 wherein said carrier is a substrate.

3. The package according to claim 1 wherein said semiconductor unit is a flip chip comprising at least a bump for electrically connecting said flip chip and said semiconductor connection zone.

4. The package according to claim 1 wherein said first surface includes a depression for accommodating said semiconductor connection zone.

5. The package according to claim 1 further comprising at least an another semiconductor unit attached to a second surface of said carrier, said second surface and said first surface being back to back.

6. The package according to claim 1 wherein said semiconductor unit is a chip.

7. The package according to claim 1 wherein said carrier includes at least a trace for the electrical connection between said cylindrical terminal and said semiconductor connection zone.

8. The package according to claim 7 wherein said cylindrical terminal is electrically connected with said trace via said terminal connection zone to form the electrical connection between said cylindrical terminal and said semiconductor connection zone.

9. The package according to claim 1 wherein said semiconductor unit is a chip with adhesive material for attaching to said semiconductor connection zone.

10. The package according to claim 1 further comprising a connection system including at least a trace, and at least a bonding wire, wherein said trace is on said carrier, and said bonding wire electrically connects said trace and said semiconductor unit.

11. The e package according to claim 1 comprising more than one cylindrical terminal located outside said semiconductor connection zone.

12. The package according to claim 1 further comprising a sealing structure for covering said semiconductor unit.

13. The package according to claim 10 further comprising a sealing structure for covering said semiconductor unit and said bonding wire.

14. The package according to claim 1 wherein said semiconductor connection zone includes adhesive material for said semiconductor unit to attach thereto, and said terminal connection zone also includes adhesive material for said cylindrical terminal to attach thereto.

15. A package for accommodating at least a relatively thick semiconductor unit, comprising:
   a carrier including a first side and a second side, said first side and said second side being back to back, said first side comprising at least a semiconductor connection zone and at least a terminal connection zone;
   at least a semiconductor unit attached to said semiconductor connection zone; and
   at least a cylindrical terminal attached to said terminal connection zone and connected to said semiconductor unit through said carrier, wherein the length of said cylindrical terminal is larger than the maximum width of the cross section of said cylindrical terminal, and said cylindrical terminal includes a core portion and an outer portion, the melting point of said core portion being higher than that of said outer portion.

16. The package according to claim 15 therein said carrier is a substrate.

17. The package according to claim 15 wherein said semiconductor unit is a flip chip comprising at least a bump for electrically connecting said flip chip and said semiconductor connection zone.

18. The package according to claim 15 further comprising a connection system including at least a trace, and at least a bonding wire, wherein said trace is on said carrier, and said bonding wire electrically connects said trace and said semiconductor unit.

19. The package according to claim 15 wherein said first side includes a depression for accommodating said semiconductor connection zone.

20. The package according to claim 15 further comprising at least an another semiconductor unit attached to said second side of said carrier.

* * * * *